United States Patent
Confalonieri et al.

(10) Patent No.: US 7,986,181 B2
(45) Date of Patent: Jul. 26, 2011

(54) CALIBRATION CIRCUIT FOR AN ADJUSTABLE CAPACITANCE

(75) Inventors: Pierangelo Confalonieri, Caponago (IT); Riccardo Martignone, Carnate (IT); Germano Nicollini, Piacenza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 681 days.

(21) Appl. No.: 12/035,235

(22) Filed: Feb. 21, 2008

(65) Prior Publication Data

US 2009/0051401 A1    Feb. 26, 2009

(30) Foreign Application Priority Data

Feb. 23, 2007   (EP) .................................... 07425099

(51) Int. Cl.
  *H03K 5/00*   (2006.01)
(52) U.S. Cl. ......... 327/553; 327/558; 327/552; 327/337
(58) Field of Classification Search ........... 327/551–559
  See application file for complete search history.

(56) References Cited

U.S. PATENT DOCUMENTS

| | | | |
|---|---|---|---|
| 5,113,090 A | 5/1992 | Imaizumi et al. | |
| 6,262,603 B1 | 7/2001 | Mohan et al. | |
| 6,417,737 B1 | 7/2002 | Moloudi et al. | |
| 6,504,349 B2 * | 1/2003 | Jaworski | 323/280 |
| 6,803,813 B1 | 10/2004 | Pham | |
| 6,972,633 B2 * | 12/2005 | Vilhonen et al. | 331/17 |
| 7,477,098 B2 * | 1/2009 | Dharmalinggam et al. | 327/553 |
| 7,627,443 B2 * | 12/2009 | Juang | 702/64 |
| 2006/0214725 A1 | 9/2006 | Rotchford et al. | |

FOREIGN PATENT DOCUMENTS

EP   1722476 A2   11/2006

OTHER PUBLICATIONS

Hester, R.K. et al., "Fully Differential ADC with Rail-to-Rail Common-Mode Range and Nonlinear Capacitor Compensation," Feb. 25, 1990, pp. 173-182, vol. 1, IEEE Journal of Solid-State Circuits, New York, US.

(Continued)

*Primary Examiner* — Dinh T. Le
(74) *Attorney, Agent, or Firm* — E. Russell Tarleton; Seed IP Law Group PLLC

(57) ABSTRACT

A calibration circuit for calibrating an adjustable capacitance of a circuit having a time constant depending on the adjustable capacitance, the calibration circuit generating a calibration signal for calibrating the capacitance and including a calibration loop, suitable to carry out a calibration cycle in several sequential steps. The calibration circuit includes a controllable capacitance for receiving a control signal and including an array of switched capacitors selectively activated by the control signal to connect to a first common node that conducts a voltage value depending on the total capacitance value of the activated capacitors; an assessment unit for comparing this voltage value with a reference voltage to output a logic signal that can transition between first and second logic levels; a control and timing unit to receive the logic signal and change the control signal to carry out a subsequent calibration step that is provided at the end of the integration interval during a comparison interval of a preset duration, which allows a transition of the logic signal to occur prior to the beginning of the consecutive calibration step.

19 Claims, 5 Drawing Sheets

OTHER PUBLICATIONS

Promitzer, "12-bit Low-Power Fully Differential Switched Capacitor Noncalibrating Successive Approximation ADC with 1 MS/s," Jul. 2001, vol. 36, No. 7, pp. 1138-1143, IEEE Journal of Solid-State Circuits.

Khalil, W. et al., "A Highly Integrated Analog Front-End for 3G," May 2003, vol. 38, No. 4, pp. 774-781, IEEE Journal of Solid-State Circuits.

Xia, B. et al., "An RC Time Constant Auto-Tuning Structure for High Linearity Continuous-Time SigmaDelta-Modulators and Active Filters," Nov. 2004, vol. 51, No. 11, pp. 2179-2188, IEEE Transactions on Circuits and Systems-1: Regular Papers.

Figueiredo, P.M. et al., "Low Kickback Noise Techniques for CMOS Latched Comparators," May 23, 2004, pp. 537-540, Proceedings ISCAS 2004.

* cited by examiner

CALIBRATION CIRCUIT FOR AN ADJUSTABLE CAPACITANCE

BACKGROUND

1. Technical Field

The present disclosure relates to calibration systems and, more particularly, to a high-precision calibration circuit for calibrating an adjustable capacitance of an integrated circuit having a time constant depending on this capacitance.

2. Description of the Related Art

In the field of integrated circuits, the need is felt for providing integrated circuits having a preset time constant depending on the product RC of a capacitance value C multiplied by a resistance value R.

For example, in the state of the art, it is known to provide integrated circuits of which the cut-off frequency is a linear (particularly, inversely proportional) function of the product RC of a resistance R multiplied by a capacitance C. The process for producing these integrated circuits has inherent variations such that the product RC actually obtained can differ noticeably from the desired product RC. In some cases, the variations can be as high as 40% or 50% in module, and this entails that there may also be a factor of 3 between the lowest and highest cut-off frequencies of the filter achievable by means of the manufacturing process.

This gives rise to a problem, for example with a low-pass filter, in that:

when the value of the effective cut-off frequency of the filter is higher than the desired value, the filter can let undesired noise pass therethrough, mainly when the latter is present about the desired cut-off frequency;

on the contrary, when the value of the effective cut-off frequency of the filter is lower than the desired value, the useful signal is dampened.

To solve these problems, several solutions have been developed that provide carrying out, after the integration process, the so-called trimming of the wafers on which the circuits are made. However, these solutions suffer from high costs in terms of additional area occupied, in terms of time required for testing the circuits, and further in terms of poor reliability. Furthermore, in some cases, these solutions are not feasible, mainly because the productive technology applied does not always provide for the components necessary for implementing these solutions.

An alternative solution to that mentioned above has been published in "IEEE JOURNAL OF SOLID-STATE CIRCUITS", vol. 38, No. 5, May 2003, in the article "A Highly Integrated Analog Front-End for 3G", and provides a self-adjusting circuit that, as compared with the trimming solutions described above, has lower consumption and lower area cost.

The self-adjusting circuit of the above-cited article is schematically represented in FIG. 1, in which it is generally designated with 1. In the article, the self-adjusting circuit 1, or calibration circuit 1, is used for adjusting the time constant RC of a low-pass filter 2, and is such to supply a calibration signal to this filter via the bus REG_BUS. The low-pass filter 2 is such as to receive an input signal to be filtered I_sig to output a corresponding filtered signal F_sig.

The calibration circuit 1 includes a calibration loop essentially comprising a switched capacitor array C_AR, an analogue comparator CMP, a control and timing logic unit TG_CNT and an interruption element SW_Res controllable by a signal Res_C and suitable to reset the switched capacitor array C_AR by short-circuiting the latter to ground.

The array switched capacitors C_AR can be selectively switched via a signal supplied by the control and timing unit TG_CNT to a bus C_BUS. The switched capacitor array C_AR is shown in FIG. 2a in greater detail.

In FIG. 2a, the array C_AR comprises four capacitors 8C, 4C, 2C, 1C, or modular capacitive elements, which are binary weighted relative to a unit capacitance of value C. Those skilled in the art will appreciate that the precision of the calibration circuit can be increased or decreased by providing a higher or lower number of modular capacitive elements, respectively.

The symbols B3, B2, . . . , B0 indicate the bits of the control signal provided to the array C_AR via the C_BUS, from the most significant bit to the least significant bit, respectively. And Sw3, . . . , Sw0 have been designated the switches for capacitors 8C, . . . , 1C, controlled by the respective bits B3, . . . , B0. These switches enable selective connecting and disconnecting (i.e., enabling and disabling) the capacitors of the array C_AR to and from node 5, the voltage of the latter being designated with VRC in FIG. 1. It should be observed that the effective capacitance $C_{eff}$ in the capacitor array C_AR depends, in a given instant, on which and how many modular capacitive elements 8C, 4C, 2C, 1C are connected to the node 5 via the switches Sw3, . . . , Sw0. It should be further observed that the capacitor array C_AR comprises a fixed capacitor Cfx, which is the lowest capacitance value required for obtaining the calibration in the case where the product RC of the filter 2 such as obtained by means of the process has a highest value relative to the tolerance range normally ensured by the process. As is known to those skilled in the art, the total capacitance value that can be set in parallel with the fixed capacitor Cfx via the modular capacitive elements 8C, 4C, 2C, 1C must be established, on the contrary, such as to be capable of ensuring the granularity required by the calibration.

The calibration cycle carried out by means of the circuit in FIG. 1 is intended to identify by trial and error a control code B3, B2, B1, B0 (produced by the timing and control logic unit TG_CNT and provided thereby to the array C_AR via the bus C_BUS) which is such as to identify a set of array enabled capacitors C_AR such as to meet a preset calibration condition. At the end of the calibration cycle, the control code B3,B2,B1,B0 obtained is sent via the bus REG_BUS to the filter 2 and represents the calibration signal. In the filter 2, this code is applied to the variable capacitor $C_{var}$ in order to obtain a preset RC=R*$C_{var}$ product in the filter 2.

Waveforms illustrating the operation of the circuit in FIG. 1 are reported in FIG. 2b.

With reference to FIGS. 1, 2a, 2b, the timing and control logic unit TG_CNT is such as to start a calibration cycle in response to a calibration-request signal C_REG and according to a timing imposed by a clock signal CK. At the beginning of each step of the calibration cycle, the timing and control logic unit TG_CNT is such as to short-circuit the array C_AR to earth, by closing the interruption element SW_Res, in order to discharge this array C_AR.

After the array has been discharged C_AR, the interruption element SW_Res is opened for a half-period of the clock signal and a certain number of modular capacitive elements 8C, . . . , 1C are connected to the node 4, by means of a selective closure of the switches Sw3, . . . , Sw0 that is commanded by the control code B3, . . . , B0.

These modular capacitive elements 8C, . . . , 1C start charging, thus causing the voltage VRC of node 5 to increase according to a transient characterized by a time constant equal to RF*$C_{eff}$ and an asymptote given by the voltage Vcc. As stated above, $C_{eff}$ represents the effective capacitance value (including the fixed capacitance value Cfx) of the array C_AR which are connected to node 4 at a given instant.

In a clock half-period, when the voltage VRC of node 4 reaches a voltage higher than voltage VCMP=VCC*R2/(R1+R2), the analogue comparator CMP will change its output state (in the example, the signal OUT_CMP will go from logic level "0" to logic level "1").

The clock signal CK is a clock having a known frequency and there exists only one product RF*$C_{eff}$ being such as to cause the voltage VRC to increase to the value VCMP in a half-period of clock signal CK. For this reason, the VCMP is set at a voltage value equal to the voltage that node VRC would achieve in a clock half-period according to a transient governed by a time constant 1/RC equal to, except for a scale factor, the desired value at which the time constant of filter 2 has to be calibrated.

In the particular circuit described in the above-cited article, the control codes sent from the timing logic unit TG_CNT to the array C_AR are generated by a counter of this unit, which is decremented at each step of the calibration cycle. The counter has a number of resolution bits equal to the number of the modular capacitive elements 8C, 4C, 2C, 1C that can be controlled by means of the control signal.

With particular reference to FIG. 2b, it should be observed that upon operation, before starting a calibration cycle, the signal RES_C short-circuits the capacitors Cfx, 8C, 4C, 2C, 1C of the array C_AR to ground until when the calibration cycle is started and the switches Sw3, . . . , Sw0 on the capacitors are such as to turn them off when they are driven with 0 or turn them on when they are driven with 1.

The switches Sw3, . . . , Sw0 are driven via the bits B3, . . . , B0 of the control code provided on the bus C_BUS. This code B3, . . . , B0 corresponds to the value of the unit counter TG_CNT. The counter, during the various steps of the calibration cycle, is decremented from the initial value 15 (in the case of 4 bits) by one unit at each period of clock signal CK.

At each decrement of the counter there corresponds a decrease, within the array C_AR, of a capacitive unit.

The first attempt (or first step) of the calibration circuit is carried out with all the capacitors of the array C_AR being enabled. When the level reached by the voltage VRC in a half-period of the clock signal CK is lower than the value of the voltage VCMP, the counter will be decremented by one unit. Consequently, also the subsequent control code B3, . . . , B0 will decrease by one unit, and thus the total capacitor of the array C_AR will be decreased by one elementary capacitor. This occurs, however, only after the array C_AR has been previously short-circuited to ground by means of the interruption element SW_Res in the half-period subsequent to the attempt described above.

During the subsequent steps, the calibration cycle is carried out by unit decrements until when the voltage value VRC achieved in one half-period is higher than the voltage VCMP. In the latter case, the cycle ends and the value reached in the counter is stored, which value will be then used as the code to be applied to the filter 2 for calibration and sent to the latter via the bus REG_BUS.

The prior solution described above suffers from several drawbacks. One of these drawbacks is that the comparator CMP has an inherent comparison delay that is higher as the voltage difference at the input thereof is lower. This delay is, accordingly, a non constant delay and further depends also on temperature and process.

Whereby, in the calibration circuit described above, when the voltage VRC exceeds the voltage VCMP before the end of the clock half-period in which the VRC is increased, but the change of the output of signal OUT_CMP outputted from the comparator CMP, due to this delay, is carried out after this half-period has ended, the logic and timing unit TG_CNT is not capable of appreciating this change of signal OUT_CMP, therefore an error is inevitably introduced in the calibration cycle. It should be observed that this problem is as much important as the clock frequency desired to be used is high.

BRIEF SUMMARY

The embodiments of the present disclosure provide a calibration circuit that does not suffer from the drawbacks described above with reference to the prior calibration circuits.

In accordance with one embodiment of the present disclosure, a calibration circuit for calibrating an adjustable capacitance of a circuit having a time constant depending on the adjustable capacitance is provided, the calibration circuit adapted to output a calibration signal carrying information for calibrating the capacitance and including a calibration loop suitable to carry out a calibration at several sequential steps. The calibration circuit includes a controllable capacitance unit suitable to receive a control signal at the beginning of a calibration step and including an array of switched capacitors that can be selectively activated by the control signal to be connected to a first common node adapted to conduct, at the end of an integration interval, a voltage value that is dependent on a total capacitance value of the activated capacitors; an assessment unit adapted to compare the voltage value with a reference voltage to output a logic signal that, based on a comparison result, can be subjected to a transition between first and second logic levels; a control and timing logic unit adapted to receive the logic signal and to change the control signal based thereon, in order to carry out a subsequent calibration step, the calibration step provided, at the end of said integration interval, with a comparison interval of a preset duration, which allows a transition of the logic signal to occur prior to the beginning of the calibration step.

In accordance with another embodiment of the present disclosure, a method for calibrating an adjustable capacitance of a circuit having a time constant depending on a variable capacitance is provided. The method is adapted to output a calibration signal carrying information for calibrating the capacitance. The method is further adapted to implement a calibration cycle with several consecutive steps, the method at a given step of the cycle including the following operations: providing a control signal to a controllable capacitance unit having an array of switched capacitors that can be selectively activated by the control signal to be connected to a first common node having, at the end of an integration interval, a voltage value depending on a total capacitance value of the activated capacitors; comparing the voltage value with a reference voltage to output a logic signal that, based on the comparison result, can be subjected to a transition between first and second logic levels; processing the logic signal to modify the control signal based thereon, which is used for carrying out a subsequent calibration step, wherein at the end of said integration interval, a comparison interval of a preset duration is provided, which allows a transition of the logic signal to occur prior to the beginning of processing the logic signal.

In accordance with another aspect of the present disclosure, a logic and timing circuit for a calibration circuit that calibrates an adjustable capacitance of an integrated circuit is provided, the calibration circuit including a comparator circuit. The logic and timing circuit includes a first input adapted to be coupled to the output of the comparator circuit and a second input adapted to receive a clock signal, a first output on which is generated a control signal in response to the output of the comparator and to the clock signal, and second and third outputs on which is generated a select signal and a reset signal, respectively, that cooperate to set a comparison interval duration, which is a duration of receiving a comparison signal from the output of the comparator circuit to allow a transition of the output of the comparison signal prior to outputting the control signal.

In accordance with another aspect of the foregoing embodiment, the comparison interval duration is equal to at least one half-period of the clock cycle. Ideally, a period of time in which the select signal and reset signal have opposite logic values is an integration period equal to at least one complete clock cycle.

In accordance with another embodiment of the present disclosure, a circuit is provided that includes a capacitance circuit having an input adapted to receive a control signal and having an output coupled to a common node on which the capacitance circuit generates a capacitance-dependent voltage value responsive to the control signal; a comparator circuit having a first input coupled to the capacitance circuit to receive the capacitance-dependent voltage value and to compare the capacitance-dependent voltage value to a reference voltage and to output a comparison signal in response to the comparison; and a logic and timing circuit having a first input coupled to the output of the comparator circuit and a second input to receive a clock signal, a first output on which is generated a control signal in response to the comparison signal received from the comparator circuit and the clock signal, and second and third outputs on which is generated a select signal and a reset signal, respectively, that cooperate to set a comparison interval duration, which is a duration of receiving the comparison signal to allow a transition in a logic value of the comparison signal prior to outputting the control signal.

BRIEF DESCRIPTION OF THE SEVERAL VIEWS OF THE DRAWINGS

The characteristics and the advantages of the present disclosure will appear more clearly from the detailed description below of preferred embodiments thereof, which have been given by way of illustration, and should be not considered as limiting with relation to the annexed figures, in which.

DETAILED DESCRIPTION

In the figures, equal or similar elements will be designated with the same numerals.

Figure 3:
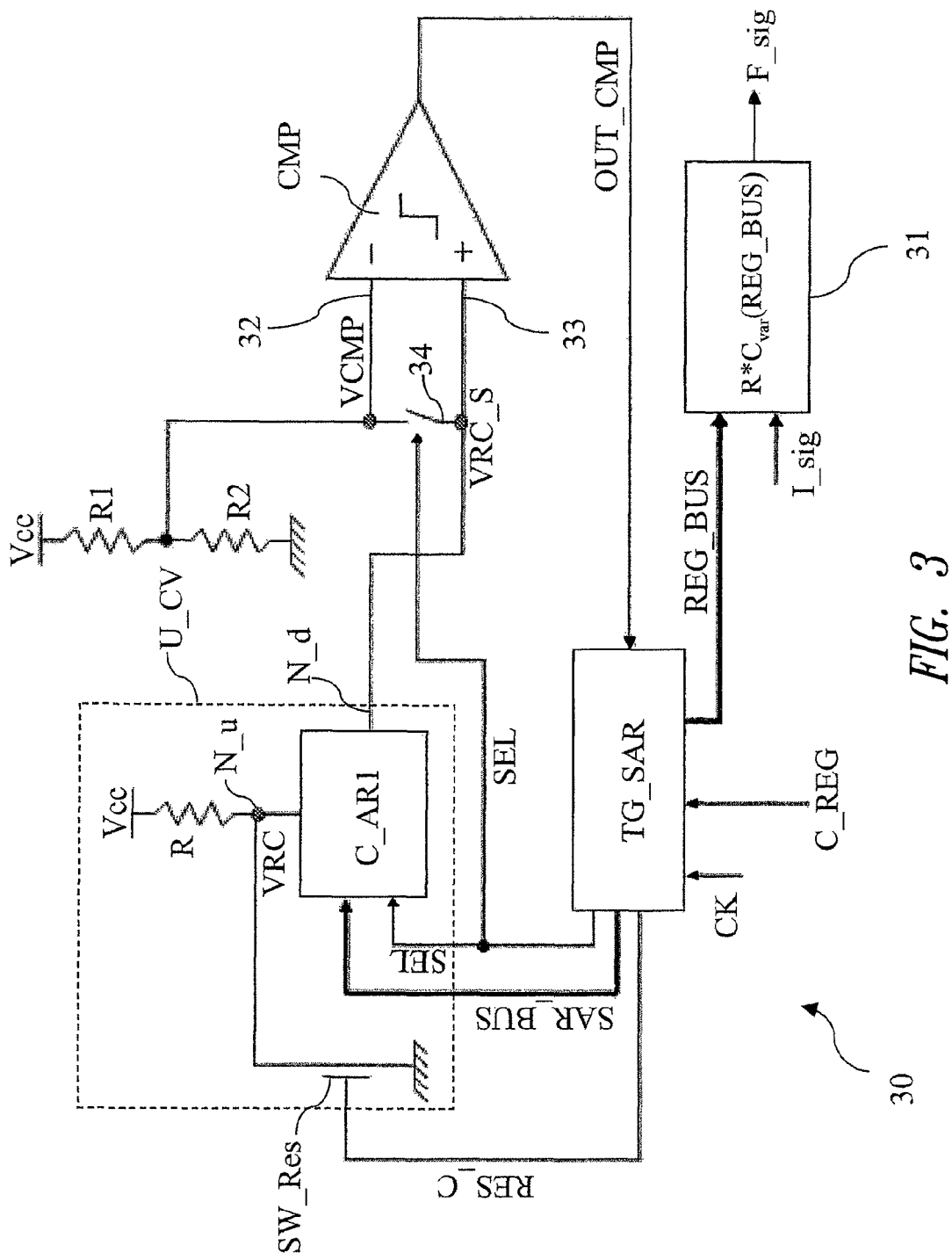
FIG. 3 schematically shows a particularly preferred embodiment of a calibration circuit in accordance with the present disclosure.

FIG. 3 shows the functional block diagram of a calibration circuit 30 according to a particularly preferred embodiment of the present disclosure. The circuit 30 in FIG. 3, at the end of a calibration cycle, is configured to output a calibration signal or code, and is adapted to send this calibration signal, in the example via a bus REG_BUS, to an integrated circuit 31. By REG_BUS will be designated herein below, according to the context, both the calibration signal and the bus on which this signal is transmitted.

The integrated circuit 31 is a circuit having a time constant depending on the product $R*C_{var}(REG\_BUS)$ in which R is a value of a resistance and $C_{var}(REG\_BUS)$ is the value of a capacitance adjustable by means of the calibration signal or code REG_BUS outputted from the calibration circuit 30. In the particular example that will be described below, the integrated circuit 31 will be assumed to be a filter, for example a low-pass filter, and having a cut-off frequency depending on the product $R*C_{var}(REG\_BUS)$. It should be considered, however, that the teachings of the present disclosure can be applied to the calibration of any integrated circuit 31 having a time constant depending on the product $R*C_{var}(REG\_BUS)$.

In the particular example illustrated herein, the filter 31 is such as to receive a signal I_sig to be filtered in order to output a filtered signal F_sig.

The calibration circuit 1 includes a calibration loop U_CV, CMP, TG_SAR for carrying out a calibration cycle in various sequential steps, or attempts. As will be better explained below, each step of the calibration cycle takes place throughout three sequential time intervals of preset duration, of which the first will be called the "reset interval", the second will be called the "integration interval" and the third will be called the "comparison interval".

The calibration loop U_CV, CMP, TG_SAR comprises a controllable capacitance unit U_CV suitable to receive, at each step of the calibration cycle, a control signal, via the bus SAR_BUS in the example.

By SAR_BUS will be designated herein below either the control signal or the bus on which this signal is transmitted, depending on the context.

The controllable capacitance unit U_CV includes at least one switched capacitor array C_AR1 that can be selectively activated at each step by means of the control signal SAR_BUS to be connected to a common node N_u having, at the end of an integration interval, a voltage value VRC depending on the total value of the activated capacitors, i.e., the total value of the capacitors actually connected to the node N_u by the signal SAR_BUS.

The controllable capacitance unit U_CV further includes means SW_Res for discharging the array of switched capacitors C_AR1 during the reset interval. In the particular example described herein, these means are embodied, in a non-limiting manner, by a switch SW_Res suitable to short-circuit the common node N_u to earth.

The calibration loop U_CV, CMP, TG_SAR, further includes an assessment unit CMP suitable to compare the voltage value VRC reached at the end of the integration interval with a reference voltage VCMP to output, as a result of the assessment, a logic signal OUT_CMP that, based on the comparison result can undergo a transition between first and second logic levels.

The calibration loop U_CV, CMP, TG_SAR, further comprises a logic and timing unit TG_SAR suitable to receive the logic signal OUT_CMP and such as to change the control signal SAR_BUS based on the logic signal OUT_CMP. The thus-changed control signal SAR_BUS at the end of a calibration step may be used in a subsequent step of the calibration cycle.

The logic and timing unit TG_SAR is also such as to provide the controllable capacitance unit U_CV with a signal RES_C suitable to discharge by means of the switch SW_Res the switched capacitor array C_AR1, during the reset interval. Furthermore, the logic and timing unit TG_SAR is such as to output a logic signal SEL that, in the circuit in FIG. 3, is arranged for performing various functions, which will be detailed below.

As illustrated in FIG. 3, the logic and timing unit TG_SAR is such as to receive a clock signal CK and a calibration cycle start request signal C_REG.

In a particularly preferred embodiment, the assessment unit CMP is an analogue voltage comparator having a first input 32, or reference input 32, and a second input 33, or signal input 33. This comparator CMP is such as to output a logic signal OUT_CMP having a first preset logic level, for example, the logic level "0", when the reference voltage VCMP appearing at the input 32 has a value equal to or higher than the voltage VRC_S appearing at the input 33, and having, on the contrary, a second preset logic level, for example the logic level "1". In a particularly advantageous embodiment, a switch 34 controllable by the signal SEL is provided in the calibration circuit 30 in order to short-circuit the two inputs 32, 33 of the comparator CMP with each other, or more precisely in order to supply the reference voltage VCMP to the input 33. This measure allows cancelling or significantly reducing the effect of the parasitic charge of the input 33 about voltage VCMP such as to allow a high precision to be maintained throughout the operation of comparing the two voltages VRC_S and VCMP, during which the switch 34 will have to be obviously opened by the logic signal SEL.

The target of a calibration cycle managed by the control and timing logic unit TG_SAR is to identify a control signal, or code SAR_BUS that is adapted to activate in the unit U_CV an amount of effective capacitance $C_{eff}$ suitable to bring, during an integration interval of a preset and known duration, the voltage VRC of node N_u to the nearest possible value to the reference voltage VCMP.

In a particularly preferred embodiment, though not to be considered as limiting, the integration interval has a duration equal to the duration of the period of the clock signal CK. It is understood that, accordingly, in this instance the period of the clock signal CK, which is assumed to be known, and the reference voltage VCMP are the references for the calibration carried out by the circuit 30. In practice, the circuit 30 has the target of searching the amount of effective capacitance of the array C_AR1 that, along with the resistance R, provides a time constant RC such as to bring the voltage VRC in a clock period to the nearest possible value to the reference voltage.

Advantageously, the selection of an integration interval equal to a period of clock signal CK, as compared with the prior solution in which this interval is equal to a half-period of the clock signal CK, allows eliminating an uncertainty in the calibration due to the variability of the duty-cycle of clock signal CK. In fact, unlike a half-period, the time duration of a clock period is a highly precise time reference.

At the end of the calibration cycle, the logic and timing unit TG_SAR may supply a calibration signal REG_BUS to the filter 31, which is practically equal to the control signal or code SAR_BUS identified at the end of the calibration cycle.

As will be detailed below, in a particularly advantageous embodiment to be considered as non-limiting, the identification of the control signal REG_BUS, for the purposes stated above, is carried out by the control and timing unit TG_SAR by means of a successive approximation search technique, entirely similar to the so-called SAR (Successive Approximation Register) technique.

In this case, the control and timing unit TG_SAR includes a successive approximation register, the content thereof is:
provided at each step of the calibration cycle as a control signal or code SAR_BUS for unit U_CV, and
provided at the end of this calibration cycle as a calibration signal or code REG_BUS for the filter 31.

The SAR search strategy, also known as the binary search, has been used for a long time in the field of analog-to-digital converters, however, it appears that its use has been so far limited to searching voltage values, or current values at the most, and not extended to searching time parameters (such as, for example, a time constant).

Figure 4:
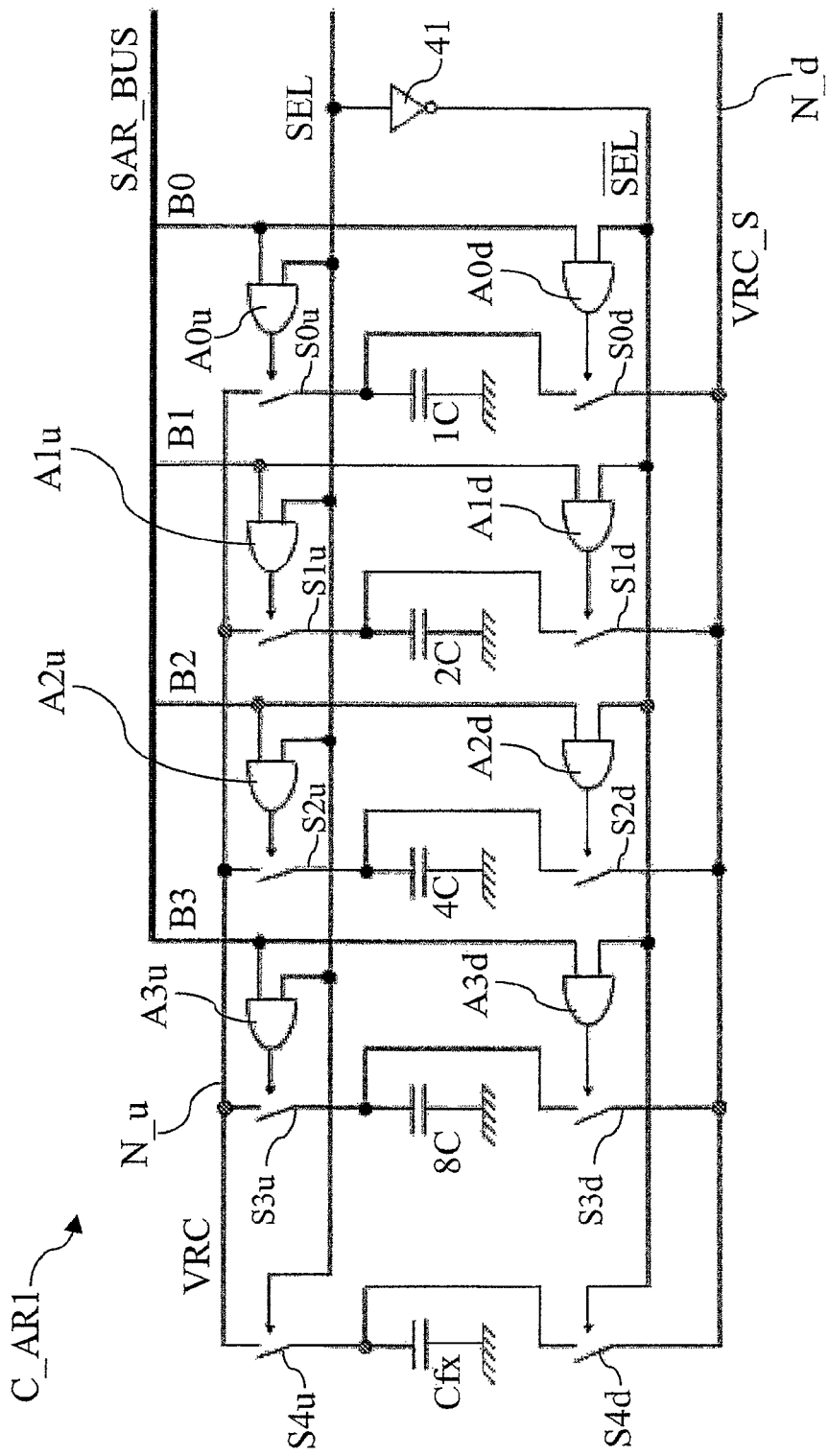
FIG. 4 shows a part of the circuit in FIG. 3 in greater detail.

FIG. 4 schematically shows a particularly preferred embodiment of the switched capacitor array C_AR1, which is such as to provide, at the end of an integration interval of a cycle step, a voltage value VRC_S to be applied to the signal input 33 of the comparator CMP and depending on the total value of the capacitance activated by the control signal SAR-_BUS in this cycle step.

Figure 2A:
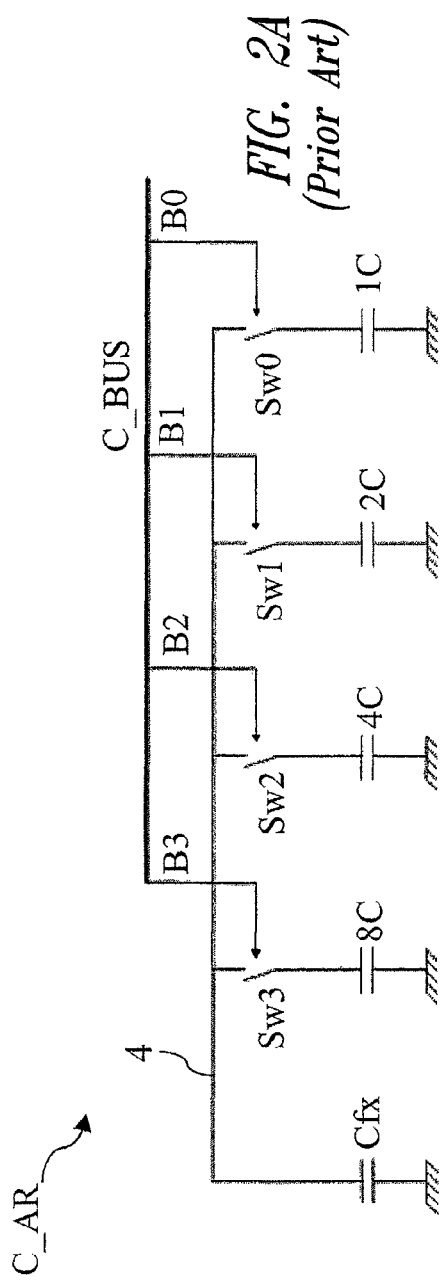
FIG. 2a shows a part of the circuit in FIG. 1 in greater detail.
Figure 2B:
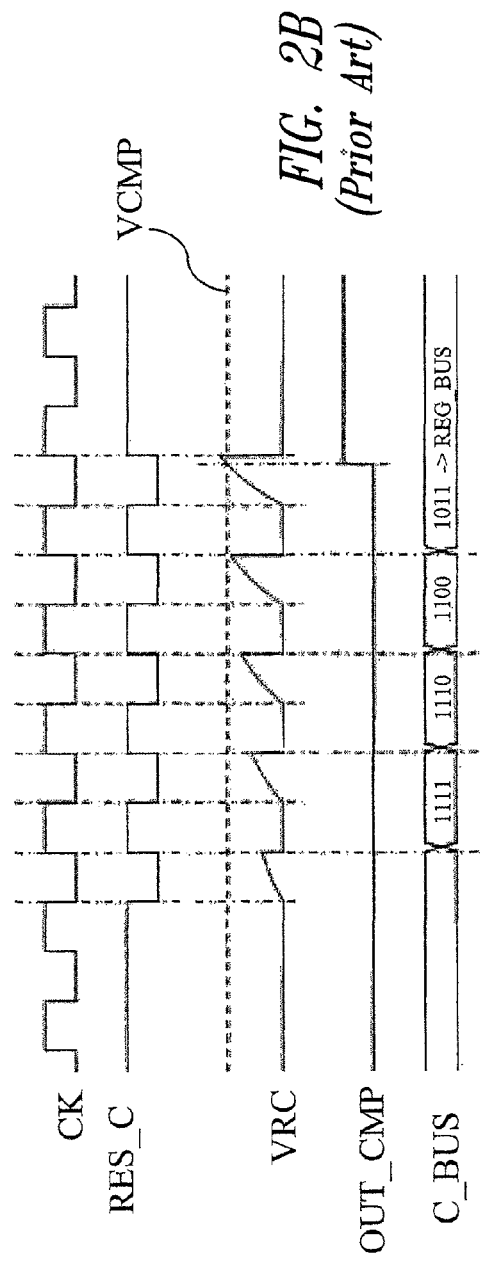
FIG. 2b shows portions of waveforms of signals involved in the operation of the circuit in FIG. 1.

In the particular example illustrated herein, only by way of example, the array C_AR1 includes four modular capacitor elements 8C, 4C, 2C, 1C and a fixed capacitor Cfx. The function of the fixed capacitor Cfx is entirely similar to that of the fixed capacitor described above with reference to the array C_AR in FIG. 2a.

Referring back to the example in FIG. 4, the control signal SAR_BUS is thus a 4-bit signal B3, B2, B1, B0 that is arranged to control a first group of respective switches S3u, S2u, S1u, S0u provided in the array C_AR1. By means of the switches S3u, S2u, S1u, S0u the modular capacitive elements 8C, 4C, 2C, 1C can be selectively and, independently from each other, connected to (i.e., enabled) or disconnected from the common node N_u for influencing (by co-operating with the resistance R, seen in FIG. 3), when not short-circuited to the earth by means of the switch SW_Res driven by the signal RES_C (seen in FIG. 3), the voltage increase transient VRC of the common node N_u. As it is known, this transient is a transient during which the current is integrated in the RC series circuit given by the resistance R of unit U_CV (seen in FIG. 3) and effective capacitance $C_{eff}$ determined by the effective value of the array capacitors C_AR1 that are connected to the common node N_u.

As may be noted in FIG. 4, the connection of the fixed capacitor Cfx and the modular capacitive elements 8c, 4C, 2C, 1C (only of those selected by the SAR_BUS) to common node N_u can take place when the logic signal SEL consents, that is, it is of a value, state, or level, to close the switches S4u, S3u, S2u, S1u, S0u (in the example, this occurs when SEL=1). It should be further observed that, in order to close the switches S3u, S2u, S1u, S0u, due to the presence of the logic ports AND A3u, . . . , A0u, a double consent is required to be provided by the bits of the control signal SAR_BUS and logic signal SEL. In the example, the logic signal SEL at each step of the calibration cycle is maintained at logic level "1" throughout the duration of a reset interval and a consecutive integration interval.

As may be noticed in FIG. 4, the control signal SAR_BUS by means of the bits B3, B2, B1, B0 is configured to control a second group of switches S3d, S2d, S1d, S0d provided in the array C_AR1. By means of these switches, the modular capacitive elements 8C, 4C, 2C, 1C can be selectively, and independently from each other, connected to (i.e., enabled) or disconnected from the common node N_d (which is the common node connected to the signal input 33 of the comparator CMP).

As may be seen in FIG. 4, the connection of the fixed capacitor Cfx and modular capacitive elements 8c, 4C, 2C, 1C (only of those that have been selected by the SAR_BUS) to the common node N_d can occur when the signal $\overline{SEL}$ consents, i.e., is of a value, state, or level, to close the switches S4d, S3d, S2d, S1d, S0d. It should be further observed that, in order to close the switches S3d, S2d, S1d, S0d, due to the presence of the logic ports AND A3d, . . . , A0d, a double consent or agreement is required to be provided by the bits of the control signal SAR_BUS and logic signal $\overline{SEL}$.

In practice, the signal $\overline{SEL}$, in the example obtained from the signal SEL by means of an inverter 41, is practically a start signal of a comparison interval having a preset duration, which is immediately consecutive to the integration interval. In the example, the signal $\overline{SEL}$ adopts, at any step of the calibration cycle, the logic level "0" (SEL=1) throughout the duration of the reset interval and integration interval and is brought to the logic level 1 (SEL=0) at the end of the integration interval to maintain this level throughout the duration of the comparison interval.

It should be observed that, in practice, the switches S4d, . . ., S0d and ports A3d, . . . , A0d are means that allow, by means of the signal $\overline{SEL}$, transferring the value VRC of voltage of the common node N_u to the common node N_d. This practically would be like saying that at the beginning of the comparison interval, the voltage VRC_S of the node N_d will adopt a value equal to the voltage value VRC. It should be observed that what practically occurs is that the voltage value VRC of node N_U:
- is reset at the beginning of a step of the calibration cycle (RES_C=1, switch SW_Res in FIG. 3 and SEL=1), for a time interval of a preset duration;
- is caused to increase (as a function of the resistance R, of the asymptote Vcc and the capacitance activated by the control signal SAR_BUS) during an integration interval of a preset duration (SEL=1);
- is stored at the end of the integration interval (SEL=1->SEL=0);
- is copied on the common node N_d (VRC_S=VRC), which maintains this value throughout the duration of the comparison interval.

Figure 1:
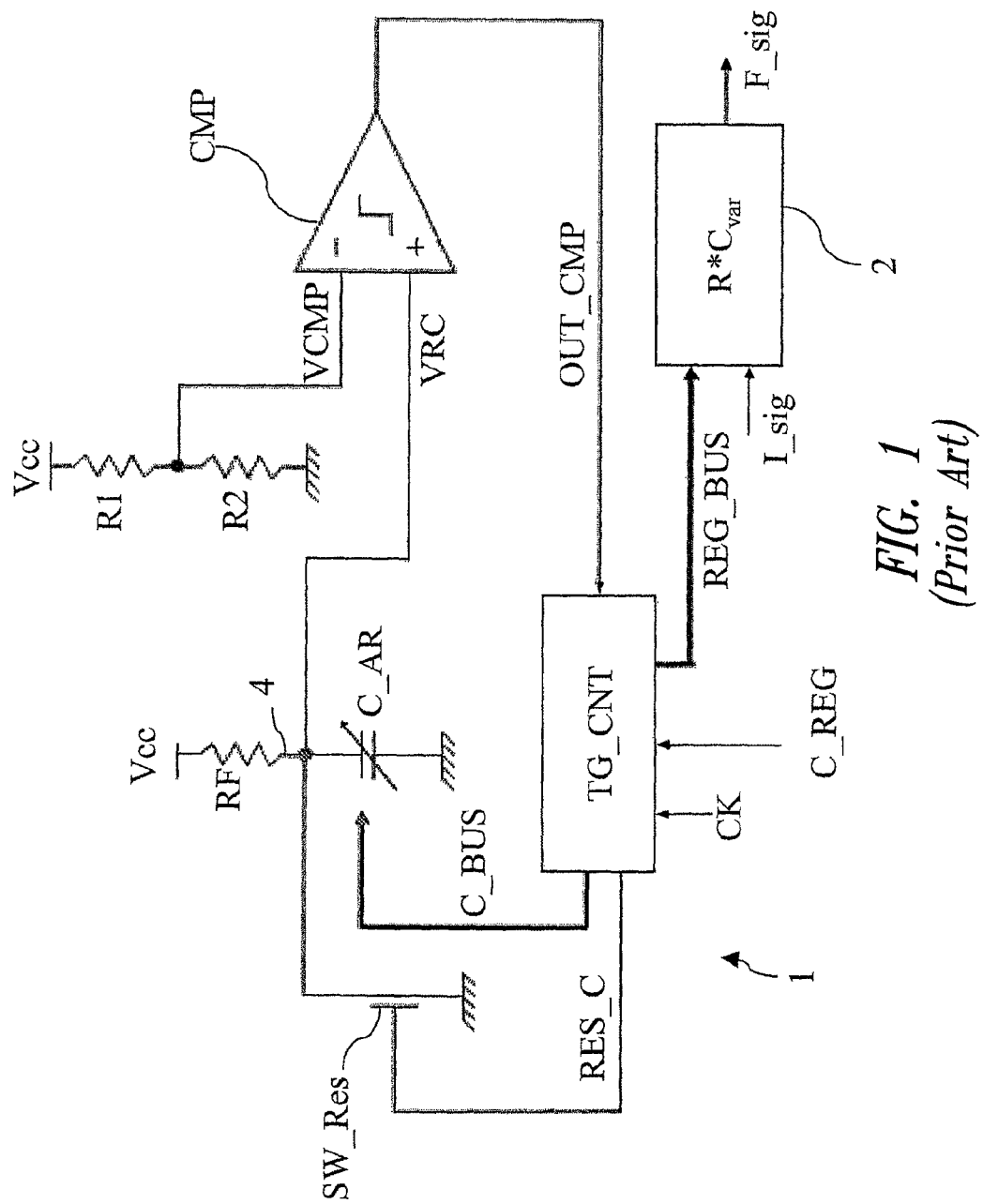
FIG. 1 shows a schematic view of a prior calibration circuit.
Figure 5:
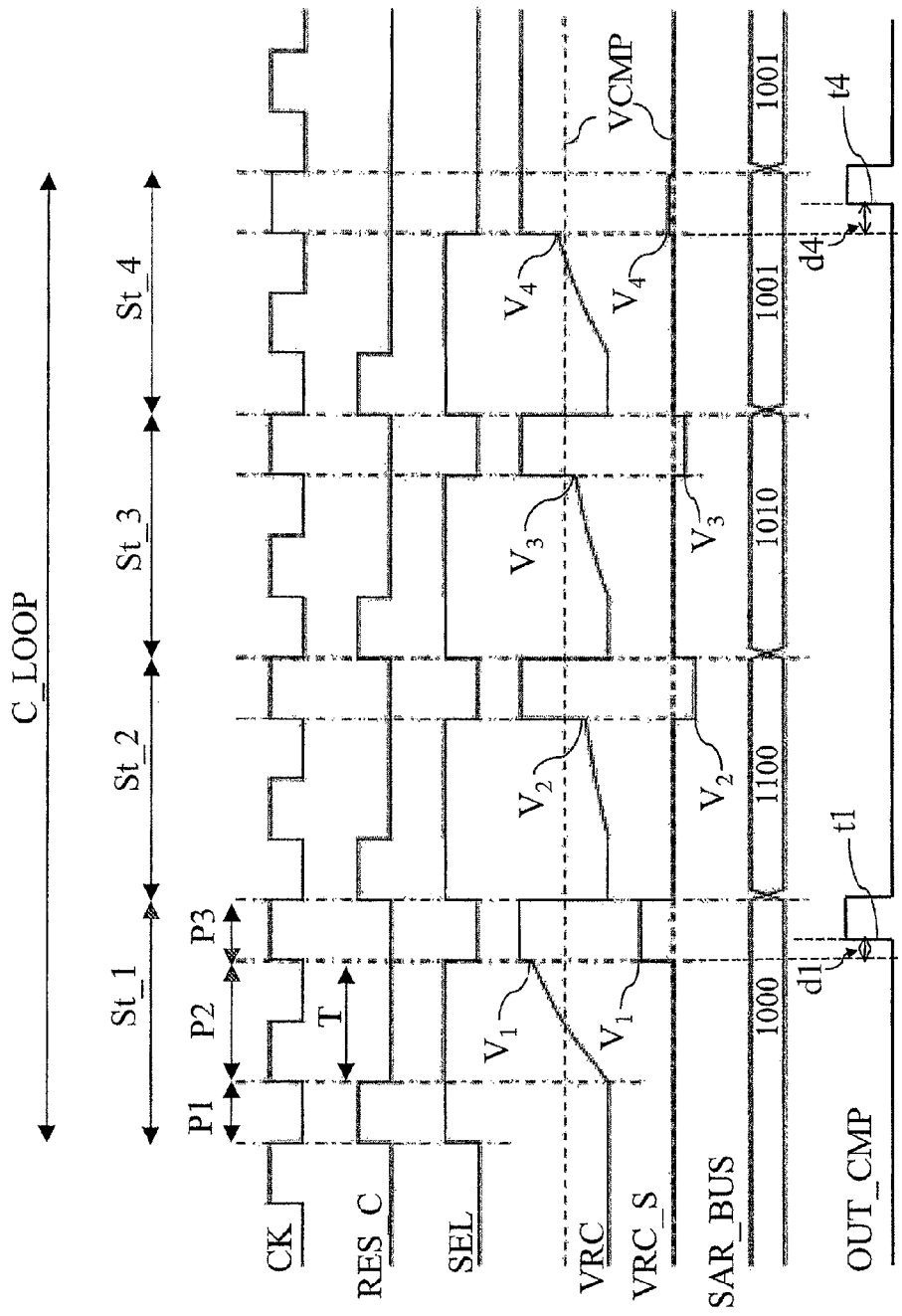
FIG. 5 shows portions of waveforms of signals involved in the operation of the circuit in FIG. 3.

FIG. 5 shows the time courses of some of the signals involved in the operation of the circuit with reference to FIGS. 3 and 4. Particularly, the signals shown in FIG. 5 relate to a calibration cycle C_LOOP carried out in four consecutive steps St_1, St_2, St_3, St_4. As may be seen in FIG. 1, each step provides a reset interval P1, an integration interval P2, and a comparison interval P3.

Upon operation, when the first step St_1 of a calibration cycle is started, for example, by the control and timing logic unit TG_SAR in response to the request signal C_REG, the control and timing logic unit TG_SAR, by bringing the signal SEL to the logic level 1 and by bringing the signal RES_C (RES_C=1) to the logic level 1, starts the reset interval P1. Simultaneously, the control and timing logic unit TG_SAR sends on the REG_BUS a first control code, according to a SAR research technique. In the example, the control code is equal to REG_BUS=B3, B2, B1, B0=1, 0, 0, 0. In practice, with reference to FIG. 4, in the array C_AR1 the switch S3u is closed (B3=1, SEL=1), whereas the remaining switches are opened. In addition to the fixed capacitor Cfx, only the capacitor 8C is thus connected to node N_u (i.e., the capacitor 8C is enabled). It should be observed that, in practice, in the embodiment illustrated in FIG. 3, only those capacitors that will be used during the integration interval P2 immediately consecutive to the reset interval P1 are discharged to ground.

As far as the RES_C is at logic level 1, the common node N_u is short-circuited to earth, i.e., VRC=0, and the capacitors Cfx and 8C are discharged. Furthermore, it should be observed that, as the logic signal SEL is at level 1, the two inputs 32 and 33 of the comparator CMP will be short-circuited by the switch 34 and thus VRC_S=VCMP will be obtained. In the example, as VCR_S is not higher than VCMP, the signal OUT_CMP outputted from the comparator CMP is at logic level 0 (alternatively, in this state, the output of the comparator may be at an intermediate level ranging between the logic levels 0 and 1, such as to speed up the level transitions).

The integration interval P2, during which the signal SEL is maintained at logic level 1, starts with the signal RES_C going to level 0. Being SEL=1, during the integration interval P2, both inputs 32 and 33 of the comparator continue to be short-circuited with each other and hence even during this interval VRC_S=VCMP and OUT_CMP=0 will be obtained.

When RES_C goes to 0, the voltage VRC of the common node N_u starts increasing with a time constant depending on the resistance R of unit U_CV and on the amount of capacitance enabled in array C_AR1 (at first step: the capacitance 8C and capacitance Cfx).

The end of the integration interval P2 is determined by the signal SEL going to 0. In the example in FIG. 5, at the end of this interval, the voltage VRC adopts a value of $V_1$. The signal SEL going to 0 determines the beginning of the comparison interval P3. Particularly, when SEL assumes level 0, the switch 34 is opened, and simultaneously, due to $\overline{SEL}$ assuming the value 1, the voltage VRC_S of common node N_d assumes the value $V_1$. The comparator CMP can, accordingly, compare the voltage value $V_1$ with the reference voltage VCMP. As a result of this comparison, being $V_1$ higher than VCMP, the signal OUT_CMP passes from the logic level 0 to logic level 1, at the transition t1. However, the entire comparison interval P3 remains to be available in order that the transition t1 of the output logic signal OUT_CMP due to the result of the comparison is produced by the comparator CMP and detected by the logic unit RG_SAR. Accordingly, with the proviso that a suitable duration of the comparison interval P3 is selected, any delay dl of the CMP is not such as to affect the precision of calibration.

It should be observed that, in the particular embodiment described herein, the comparator CMP has a comparison interval P3 available, which is equal to a half-period of the clock signal CK in order to produce its result. Thereby, as the speed required of comparator CMP is relatively low, the design of comparator CMP is easier and consumption is thus reduced.

In the particular example described herein, the comparison interval P3 has been allocated a half-period of clock signal CK; however, when there are no stringent requirements on the time needed for carrying out one calibration cycle, it is possible to provide a comparison interval P3 having a longer duration (such as equal to a period, or generally equal to an integer multiple of the half-period of the clock signal CK).

Based on the detected logic level of signal OUT_CMP, the logic unit TG_SAR will change the signal SAR_BUS at the subsequent step, such as to enable (relative to the preceding step) a higher capacitance value in the array C_AR1 if the comparator CMP has detected that the voltage VCR_S has exceeded the reference voltage VCMP, or vice versa, a lower capacitor voltage.

The remaining steps of the calibration cycle St_2, St_3, St_4 are carried out in an entirely similar manner to step St_1 described above.

As stated above, in a particularly preferred embodiment, the control and timing unit TG_SAR is such as to start the various attempts by following a SAR search strategy. In the example in FIG. 5, in fact, it is observed that:
- the first step St_1 is carried out with signal SAR_BUS=B3, B2, B1, B0=1, 0, 0, 0;
- it is detected that VRC_S=$V_1$>VCMP and consequently B3=1 is confirmed and B2=1 is set;

the second step St_2 is thus carried out with the signal SAR_BUS=B3, B2, B1, B0=1, 1, 0, 0;
it is detected that VRC_S=$V_2$<VCMP and consequently B3=1 is confirmed and B2=0, B1=1 e B0=0 are set;
the third step St_3 is thus carried out with the signal SAR_BUS=B3, B2, B1, B0=1, 0, 1, 0;
it is detected that VRC_S=$V_3$<VCMP and consequently B3=1, B2=0 are confirmed and B1=0, B0=1 are set;
the fourth step St_4 is thus carried out with the signal SAR_BUS=B3, B2, B1, B0=1, 0, 0, 1;
it is observed that VRC_S=$V_4$>VCMP and consequently B3=1, B2=0, B1=0, B0=1 are confirmed;
the thus-obtained code is then sent on the REG_BUS for calibrating the filter 31.

This filter 31 may be provided with an adjustable capacitance $C_{var}$ identical to the switched capacitor array C_AR1, or an array with scaled capacitors relative to the latter. It should be further observed that, advantageously, in a typical use, the calibration circuit and the filter are integrated on a same circuit for forming a whole self-calibrating system.

It should be further observed that, if the total time of the calibration cycle C_LOOP is not a particular system requisite, alternatively to the SAR technique illustrated above, a monotonic research can be used by the control and timing unit TG_SAR, for example by means of a counter, such as described in the above-cited prior art article.

It is appreciated from what has been stated above, that a calibration circuit in accordance with the present disclosure is capable of achieving the pursued object, in that the circuit described herein results to be practically insensitive to the effects of the comparator delay.

Obviously, to a calibration circuit according to the present disclosure, those skilled in the art, aiming at satisfying contingent and specific requirements, may carry out a number of modifications and variations, all being however contemplated within the scope of protection of the disclosure, such as defined in the annexed claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit comprising:
a controllable capacitance unit structured to receive a control signal and a selected signal and including an array of switched capacitors structured to be selectively activated by the control signal and be connected in response to the selectional signal to a first common node that is structured to conduct a voltage value that is dependent on a total capacitance of the activated capacitors;
an assessment unit adapted to receive and compare the voltage value with a reference voltage and to output a logic signal that, based on a comparison result, can be subjected to a transition between first and second logic levels;
a control and timing logic unit adapted to receive the logic signal and to generate the control signal and the selection signal based thereon, the control and timing logic unit structured to change the control signal during calibration cycle in sequential steps using a successive approximation search strategy.

2. The circuit according to claim 1 wherein the controllable capacitance unit is adapted to store the voltage value and to supply the stored voltage value to the assessment unit for carrying out the comparison.

3. The circuit according to claim 1 wherein the controllable capacitance unit includes:
a second common node coupled to the assessment unit, and
a switch circuit structured to transfer the voltage value from the first common node to the second common node.

4. The circuit according to claim 3 wherein the switch circuit is structured to disconnect the capacitors from the first common node and connect them to the second common node.

5. The circuit according to claim 4 wherein the assessment unit comprises a voltage comparator having a first input terminal supplied by the reference voltage and a second input terminal connected to the second common node.

6. The circuit according to claim 5, further including means that can be activated and deactivated by an enable signal for short-circuiting, during said integration interval, the second input of the comparator.

7. The circuit according to claim 1 wherein the control and timing logic unit includes a Successive Approximation Register structured to implement the successive approximation search strategy.

8. A system, comprising:
a circuit having a controllable capacitance unit structured to receive a control signal and including an array of switched capacitors structured to be selectively activated by the control signal and be connected to a first common node that is structured to conduct a voltage that is dependent on a total capacitance of the activated capacitors for adjusting a time constant of said circuit; and
a calibration circuit, that includes:
a controllable capacitance unit structured to receive a control signal and a selection signal and including an array of switched capacitors structured to be selectively activated by the control signal and be connected by the selection signal to a first common node that is structured to conduct a voltage that is dependent on a total capacitance of the activated capacitors;
an assessment unit adapted to receive and compare the voltage with a reference voltage and to output a logic signal that, based on a comparison result, can be subjected to a transition between first and second logic levels;
a control and timing logic unit adapted to receive the logic signal and the selection signal and to generate the control signal based thereon, the control and timing logic unit structured to change the control signal in sequential steps using a successive approximation search strategy.

9. The system according to claim 8 wherein the circuit having the controllable capacitance unit comprises a filter having a cut-off frequency depending on the controllable capacitance unit output.

10. A method for calibrating an adjustable capacitance of a circuit having a time constant depending on the adjustable capacitance, the method adapted to output a calibration signal carrying information for calibrating the adjustable capacitance, the method adapted to implement a calibration cycle with several consecutive steps, the method comprising the following operations:

provide a control signal and the selection signal to a controllable capacitance unit having an array of switched capacitors structured to be selectively activated by the control signal and be connected in response to the selection signal to a first common node structured to conduct a voltage having a voltage value that is dependent on a total capacitance of the capacitors coupled to the first common node;

comparing the voltage value in a comparison circuit with a reference voltage and outputting a logic signal that, based on the comparison result, can be subjected to a transition between first and second logic levels;

processing the logic signal to generate the control signal and the selection signal using a control and timing logic in accordance with a successive approximation search technique in an SAR to modify the control signal based thereon, which is used for carrying out a subsequent calibration step.

11. The method according to claim 10 wherein said operations are timed by a clock signal, and wherein the operations are conducted in consecutive steps that include:
  a reset interval;
  an integration interval that has a duration equal to a period of the clock signal; and
  a comparison interval that has a duration equal to at least one half-period of the clock signal.

12. The method according to claim 11 wherein the voltage value is stored at the end of the integration interval, and the comparing is carried out at a beginning of the comparison interval.

13. A logic and timing circuit for a calibration circuit that calibrates an adjustable capacitance circuit having a plurality of capacitors of an integrated circuit, the calibration circuit including a comparator circuit coupled to the adjustable capacitance circuit, the logic and timing circuit comprising:
  a first input adapted to be coupled to the output of the comparator circuit and a second input adapted to receive a clock signal, a first output on which is generated a control signal in response to the output of the comparator and to the clock signal, and second and third outputs on which is generated a select signal and a reset signal, respectively, that cooperate to set a comparison interval duration that is used to control outputting of the control signal, the comparison duration interval being a duration of a transition of a comparison signal from one logic level to a next logic level on the output of the comparator circuit; and wherein the adjustable capacitance circuit is coupled to receive the reset signal, the control signal and the selection signal; and each capacitor of the adjustable capacitance circuit is selected by the control signal and the selection signal.

14. The logic and timing circuit of claim 13 wherein the comparison interval duration is equal to at least one half-period of the clock signal.

15. The logic and timing circuit of claim 14 wherein a period of time in which the select and reset signals have an opposite logic value comprises an integration period equal to at least one complete clock cycle.

16. The logic and timing circuit of claim 15 wherein the logic and timing circuit comprises a successive approximation register adapted to change the control signal using a successive approximation register search strategy.

17. A circuit, comprising:
  a capacitance circuit a plurality of capacitors having an input adapted to receive a control signal and having an output coupled to a common node on which the capacitance circuit generates a capacitance-dependent voltage value responsive to the control signal;
  a comparator circuit having a first input coupled to the capacitance circuit to receive the capacitance-dependent voltage value and to compare the capacitance-dependent voltage value to a reference voltage and to output a comparison signal in response to the comparison; and
  a logic and timing circuit having a first input coupled to the output of the comparator circuit and a second input to receive a clock signal, a first output on which is generated a control signal in response to the comparison signal received from the comparator circuit and the clock signal, and second and third outputs on which is generated a select signal and a reset signal, respectively, that cooperate to set a comparison interval duration that controls outputting of the control signal, the comparison interval duration being a duration of a transition of the comparison signal from one logic level to a next logic level on the output of the comparator circuit; and wherein the capacitance circuit is coupled to receive the reset signal, the control signal and the selection signal; and each capacitor of the capacitance circuit is selected by the control signal and the selection signal.

18. The circuit of claim 17 wherein the comparison interval duration is equal to at least one half-period of the clock signal, and wherein a period of time in which the select signal and reset signal have opposite logic values comprises an integration period equal to at least one complete clock cycle.

19. The circuit of claim 18 wherein the logic and timing circuit comprises a successive approximation register that changes the control signal by means of a successive approximation register search strategy.

* * * * *